United States Patent [19]
Herrington

[11] Patent Number: 5,357,156
[45] Date of Patent: Oct. 18, 1994

[54] ACTIVE CLAMP CIRCUIT SCHEME FOR CMOS DEVICES

[75] Inventor: Scott K. Herrington, Austin, Tex.

[73] Assignee: Lattice Semiconductor Corporation, Hillsboro, Oreg.

[21] Appl. No.: 911,841

[22] Filed: Jul. 10, 1992

[51] Int. Cl.$^5$ .................. H03B 1/04; H03K 5/153
[52] U.S. Cl. .................. 307/542; 307/549; 307/550; 307/568; 307/359; 307/360; 307/264
[58] Field of Search ............. 307/264, 542, 549–550, 307/568, 359–360

[56] References Cited

U.S. PATENT DOCUMENTS 4,943,739 7/1990 Slaughter ................. 307/542

FOREIGN PATENT DOCUMENTS 8807791 10/1988 World Int. Prop. O. ......... 307/542

Primary Examiner—Margaret R. Wambach
Attorney, Agent, or Firm—Skjerven, Morrill, MacPherson, Franklin & Friel

[57] ABSTRACT

An improved pin clamp is described. According to one embodiment of the invention, a pin clamp circuit with improved undershoot clamping characteristics is provided. The clamp circuit actively senses the pin voltage and enhances this voltage so as to cause a voltage-to-current converter to transmit an increased amount of clamp current, relative to prior art passive clamps, to the device pin for a given amount of pin undershoot. As a result, the pin undershoot is clamped more effectively than has been the case with passive clamps. Further, since more clamp current may pass for a given voltage-to-current converter size, smaller clamp circuit components may be used. The clamp circuit according to the invention may be used generally with integrated circuit devices, but it is particularly useful in applications where bipolar devices are not available or might create adverse effects.

26 Claims, 8 Drawing Sheets

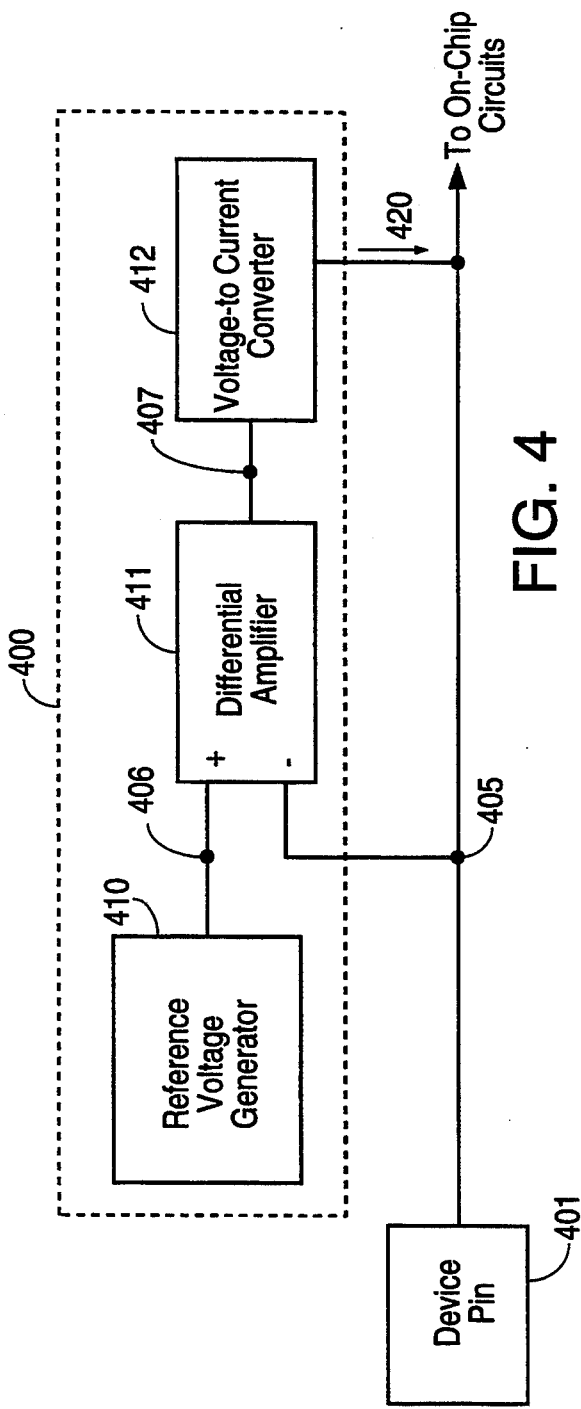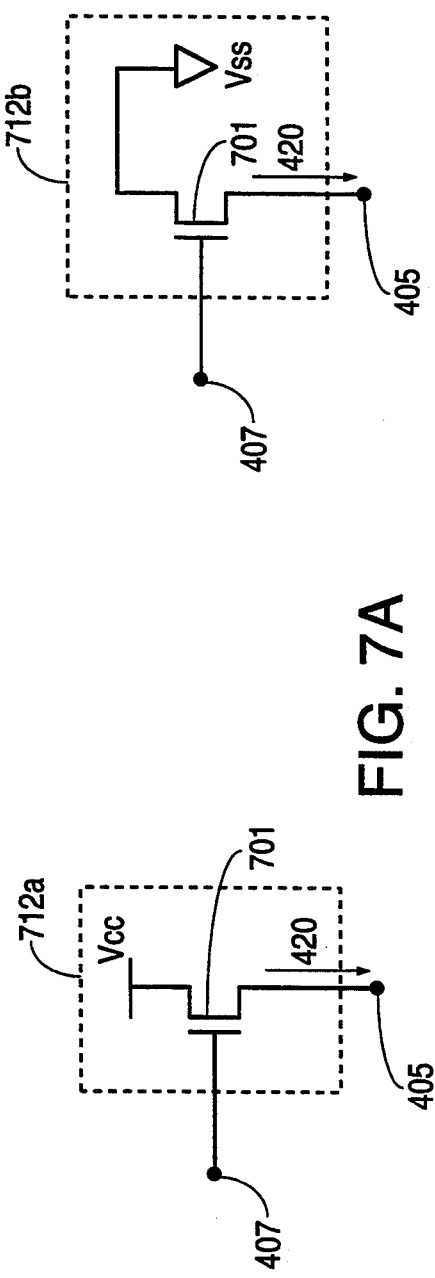

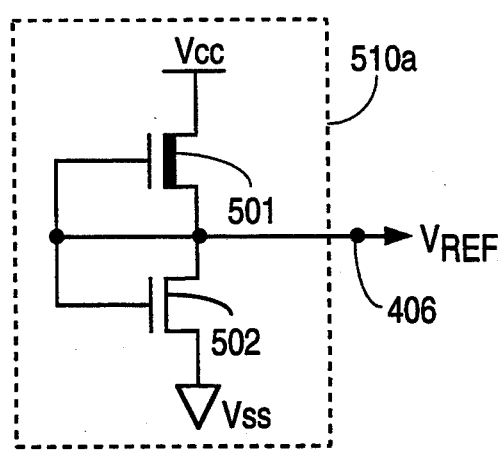
FIG. 5A
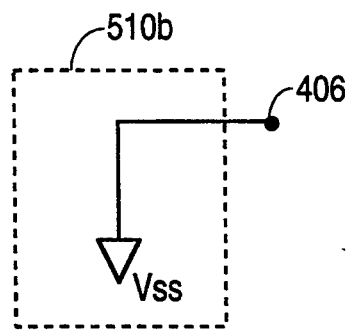
FIG. 5B
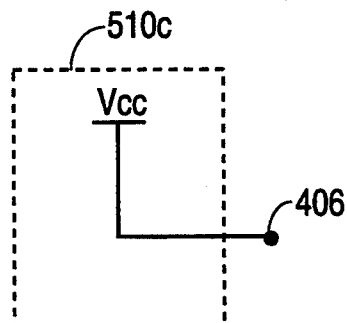
FIG. 5C
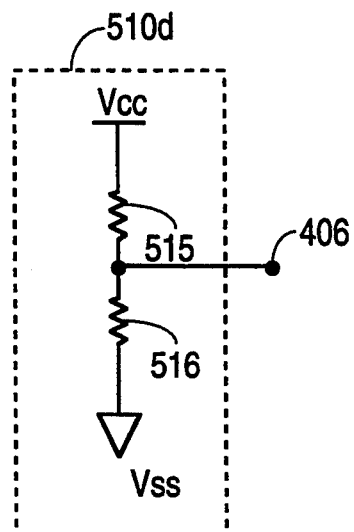
FIG. 5D
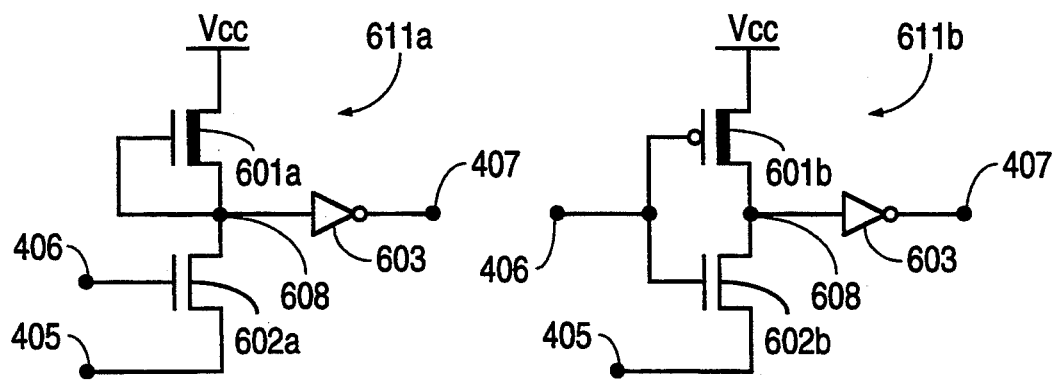
FIG. 6A
FIG. 6B

ACTIVE CLAMP CIRCUIT SCHEME FOR CMOS DEVICES

BACKGROUND OF THE INVENTION

1. Field of the Invention

This invention relates to integrated circuit devices and, in particular, to the clamping of signal voltages at the pins of integrated circuit devices.

2. Related Art

Advances in digital integrated circuit technology have resulted in devices that operate at increasingly high frequencies. One system-level by-product of such operation is an increased tendency for inter-chip signals to develop significant levels of distortion. This distortion includes numerous undesirable characteristics, e.g., signal undershoot, signal overshoot, signal ringing and signal reflection.

There are many potential sources of signal distortion in a modern digital system implementation. One significant source of signal distortion is impedance mismatch in a signal propagation path. Impedance mismatch gives rise to distortions commonly referred to as "transmission line effects." These effects, along with other signal distortions, tend to become more pronounced (and detrimental) as the operating frequency of the digital system increases. Current operating frequencies of digital systems approach 100–200 MHz. At this speed, board-level traces of approximately two or more inches may induce significant transmission line effects.

FIG. 1 illustrates both an "ideal" undistorted inter-chip signal voltage 100 and a "real" distorted inter-chip signal voltage 110 in a typical digital system. FIG. 1 is a graph of signal voltage versus time as the inter-chip signal transitions from a logic high voltage 121 to a logic low voltage 120 and back to a logic high voltage 121 again. The logic high voltage 121 and logic low voltage 120 levels are system design and technology dependent values that are typically known and fixed values for a given system implementation.

With respect to the ideal signal voltage 100, two points should be noted. First, the voltage 100 transitions between logic low voltage 120 and logic high voltage 121 infinitely fast. Second, at the end of a transition, the voltage 100 does not overshoot or undershoot the new voltage level, but rather stops precisely at that level.

In contrast to the ideal signal voltage 100, the voltage transitions for a real signal voltage 110 require a finite, non-zero amount of time. Transition times (10%–90%) of 1–3 nanoseconds are typical of current digital systems. Additionally, unlike the ideal signal voltage 100, the real signal voltage 110 exhibits signal distortions such as undershoot 111 when transitioning to logic low voltage 120, overshoot 112 when transitioning to logic high voltage 121, and ringing (i.e., damped oscillation about either the system logic high voltage 121 or system logic low voltage 120).

These signal distortions have created numerous problems for system designers. The problems include: device malfunction due to spurious input and/or output transitions, device latch-up (particularly in CMOS technology), and device violation of AC and/or DC parametric specification. Since the source of the undesirable signal distortions in digital systems is a function not only of the integrated circuit components, but also of "external" factors (e.g., printed circuit board design and layout, component drive requirements and associated loading, and system frequency), it is important for integrated circuit manufacturers to provide products with a high degree of tolerance and insensitivity to the previously described signal distortions.

Clamp circuits have been used on the input and output pins of integrated circuit devices for many years to minimize the creation and maintenance of the aforementioned signal distortions in digital systems. All prior art clamp circuits operate on the principle of providing a variable impedance for each device pin. Depending on the magnitude of the incoming voltage signal, the clamp circuit appears as either high impedance (an open circuit) or low impedance (a short circuit) to the incoming voltage signal.

FIG. 2A is a graph of clamp current versus pin voltage. The clamp current versus pin voltage characteristic 200 of an ideal clamp circuit is shown. When the pin voltage is between the system logic high voltage 202 and system logic low voltage 201, the clamp circuit operates as an open circuit and has no effect on the signal voltage present at the device pin (i.e., the clamp current is zero).

When the pin voltage either falls below the system logic low voltage 201 or rises above the system logic high voltage 202, the clamp circuit operates as a short circuit (i.e., switches from high impedance to low impedance) and sources any necessary current 203 or 204 to prevent the pin voltage from falling below the system logic low voltage 201 or rising above the system logic high voltage 202.

FIG. 2B illustrates the effect of an ideal clamp circuit on the real signal voltage 110 illustrated in FIG. 1. A perfectly clamped signal voltage 220 is produced. The ideal clamp circuit eliminates the undesirable voltage undershoot 111 and overshoot 112 by "clamping" the signal voltage to either the system logic high voltage 202 or system logic low voltage 201, as applicable. The ideal clamp circuit does not affect the signal voltage when it is within an acceptable operation region, i.e., between the system logic high voltage 202 and the system logic low voltage 201.

Actual prior art clamp circuits only approximate the ideal clamp circuit characteristic 200. Actual prior art clamp circuits all produce a qualitatively similar clamp current versus pin voltage characteristic 250 as illustrated in FIG. 2A. As seen in FIG. 2A, there are two areas in which actual prior art clamp circuits are non-ideal.

First, the pin voltages 251 and 252 at which prior art clamp circuits turn on are below and above, respectively, the pin voltages 201 and 202 at which the ideal clamp circuit turns on, typically by about 0.5–0.7 volts. These voltage differences 255 and 256 represent the clamp circuit "turn-on" voltages at which the clamp circuit switches from high impedance to low impedance.

Second, the low impedance state of the prior art clamp circuits exhibits a non-zero resistance. This variable resistance is equal to the slopes 253 and 254 of the clamp current versus pin voltage characteristic 250 when the pin voltage falls below, respectively, the system logic low voltage 201 by the amount of the turn-on voltage 255 or the system logic high voltage 202 by the amount of the turn-on voltage 256. The more quickly the slopes 253 and 254 become steep, the more closely the prior art clamp circuit approximates an ideal clamp circuit.

FIG. 2B illustrates the effect of an actual clamp circuit on the real signal voltage 110. A partially clamped signal voltage 221 is produced. The actual clamp circuit reduces, but does not eliminate, voltage undershoot 111 and voltage overshoot 112. Further, some signal ringing still remains as shown by the damped oscillations about both the system logic high voltage 121 and the system logic low voltage 120.

It is to be understood that the relationships between the unclamped, ideally clamped and actually clamped clamp current versus pin voltage characteristics shown in FIG. 2A and pin voltages shown in FIG. 2B are qualitatively, but not necessarily quantitatively accurate.

Prior art clamp circuits may be broadly classified into three groups: PN diode clamp circuits, Schottky diode clamp circuits, and grounded-gate MOS transistor clamp circuits.

A typical PN diode clamp circuit 310 is illustrated in FIG. 3A. The clamp circuit 310 has been used with both bipolar and CMOS integrated circuits for many years. The clamp circuit 310 utilizes the turn-on characteristics of PN diodes 311 and 312 to create the desired impedance characteristics. Diode 311 minimizes pin voltage overshoot and diode 312 minimizes pin voltage undershoot. The characteristics of PN diodes are well known and will be described here only as they apply to the characteristics of the clamp circuit 310.

The two PN diode parameters of interest are the diode forward turn-on voltage, $V_F$, and the diode forward current, $I_F$. $V_F$ is typically approximately 0.7 volts. In the clamp circuit 310, diode 311 has one terminal connected to the system supply voltage $V_{CC}$ (the system logic high voltage level) and the other terminal connected to the device pin voltage at node 315. Diode 312 has one terminal connected to the system ground voltage $V_{SS}$ (the system logic low voltage level) and the other terminal connected to the device pin voltage at node 315. Thus, for the clamp circuit 310, the turn-on voltage 252 shown in FIG. 2 is equal to $V_{CC}+V_F$ and the turn-on voltage 251 is equal to $V_{SS}-V_F$.

The current-sourcing ability (i.e., clamp circuit impedance) of a PN diode is known to be exponentially related to the voltage across the diode. Thus, small changes in voltage across the diode produce a relatively large diode current (relatively small diode impedance). PN diode impedance is also a relatively weak function of the physical size of the diode (silicon area) on the integrated circuit chip, but this is typically not a substantial limitation in utilizing PN diode clamp circuits.

The clamp circuit 310 works well with bipolar integrated circuits, but has the undesirable operating characteristic of creating "minority carriers" which can induce latch-up in CMOS integrated circuits. When used with CMOS integrated circuits, the clamp circuit 310 requires very large areas of "guard ring" structures in order to minimize latch-up potential. The use of large guard-ring structures can have a significant adverse impact on the die size, and hence cost, of a CMOS integrated circuit.

A typical Schottky diode clamp circuit 320 is illustrated in FIG. 3B. Schottky diode 321 is placed between system supply voltage $V_{CC}$ and the device pin voltage at node 315, and Schottky diode 322 is placed between system ground voltage $V_{SS}$ and the device pin voltage at node 315.

The operation of the Schottky diode clamp circuit 320 is similar to that of the PN diode clamp circuit 310 with two exceptions: 1) Schottky diode forward turn-on voltage, $V_F$, is typically approximately 0.5 volts (i.e., the Schottky diode is more ideal than the PN diode), and 2) Schottky diodes do not induce significant amounts of minority carriers (i.e., use of a Schottky diode clamp circuit 320 with CMOS integrated circuits would not require large guard-ring structures).

The clamp circuit 320 is widely utilized in bipolar integrated circuits because Schottky diodes are easily implemented in bipolar wafer fabrication processes. However, Schottky diodes are not easily implemented in CMOS wafer fabrication processes, so the use of the clamp circuit 320 in CMOS integrated circuits is very limited.

A typical grounded-gate transistor clamp circuit 330 comprising N-channel enhancement-mode MOS transistors 331 and 332 is illustrated in FIG. 3C. Transistor 331 is placed between system supply voltage $V_{CC}$ and the device pin voltage at node 315. The gate of transistor 331 is connected to the device pin voltage at node 315. Transistor 332 is placed between system ground voltage $V_{SS}$ and the device pin voltage at node 315. The gate of transistor 332 is connected to the system ground voltage $V_{SS}$.

The clamp circuit 330 operates similarly to the previously described clamp circuits 310 and 320. The turn-on voltage $V_{TN}$ for modern N-channel MOS transistors is approximately 0.5–0.6 volts. The current-sourcing ability of a MOS transistor (i.e., the clamp current of clamp circuit 330) is given by the equation:

$$I_{clamp} = \frac{\beta}{2} * (V_{GS} - V_{TN})^2 \qquad (1)$$

where $V_{GS}$ is the gate-to-source voltage of the transistor and $\beta$ is a transistor transconductance parameter that is given by the equation:

$$\beta = \frac{\mu * C_{OX} * W}{L} \qquad (2)$$

where $\mu$ and $C_{OX}$ are process dependent parameters, and W and L are design dependent parameters that represent the transistor width and length, respectively. As can be seen from equation (1), the clamp current for the clamp circuit 330 is quadratically related to $V_{GS}$ and linearly related to $\beta$. For a given transistor design (i.e., $\beta$ fixed), the clamp current of the clamp circuit 330 is strictly a quadratic function of $V_{GS}$.

The clamp circuit 330 has been widely utilized in CMOS integrated circuits because it does not require large guard-ring structures (as do PN diodes), and because it does not require complex processing steps (as do Schottky diodes or PN diodes). The primary disadvantage of the clamp circuit 330 is that, due to the weak quadratic dependence of transistor current on transistor gate-to-source voltage, the clamp circuit 330 may require very large physical transistors (large W/L ratio) in order to achieve satisfactorily low values of clamp circuit impedance.

Thus, in choosing a clamp circuit for a CMOS integrated circuit device, a tradeoff must be made between die size, latch-up sensitivity and wafer processing complexity.

SUMMARY OF THE INVENTION

An improved pin clamp circuit is described that addresses the problems noted above. The pin clamp circuit according to the invention is an active clamp circuit that may be used on either input or output pins. The clamp circuit according to the invention consumes little or no power in normal use. Power is consumed primarily when the clamp circuit is actively clamping the pin voltage. The turn-on voltages for clamping pin undershoot and overshoot may be independently adjusted by varying certain design parameters of the clamp circuit. In the clamp circuit according to the invention, very low values of clamp impedance are achievable with reasonable clamp circuit device sizes. The clamp circuit according to the invention does not incorporate minority carrier devices so that latch-up sensitivity is reduced when the clamp circuit is used in CMOS devices. The clamp circuit according to the invention may be formed using standard CMOS wafer processing steps.

According to one embodiment of the invention, a pin clamp circuit utilizes a differential comparator and amplifier to monitor the integrated circuit device pin voltage and compare the pin voltage to a predetermined reference voltage. The output voltage of the differential amplifier is used to drive a voltage-to-current converter connected to the device pin.

When the device pin voltage is in the "normal" operating region (i.e., between the system logic high voltage and the system logic low voltage), the voltage-to-current converter is off (i.e., high impedance). When the device pin voltage moves outside of the normal operating region (i.e., either rising above the system logic high voltage or falling below the system logic low voltage), the output voltage of the differential amplifier turns on the voltage-to-current converter so that current is supplied to the device pin such that the pin voltage is returned to the normal operating region. Once the pin voltage returns to the normal operating region, the output voltage of the differential amplifier adjusts so that the voltage-to-current converter is turned off. The impedance of the clamp circuit when the voltage-to-current converter is turned on is controlled by both the gain of the differential amplifier and the characteristics of the voltage-to-current converter.

The pin clamp circuit according to the invention may be used with either input pins or output pins, and may be designed so that undershoot, overshoot, or both undershoot and overshoot are clamped. In embodiments of the invention in which only undershoot is clamped, the reference voltage will be close to the system logic low voltage. In embodiments of the invention in which only overshoot is clamped, the reference voltage will be close to the system logic high voltage. In embodiments of the invention in which both undershoot and overshoot are clamped, two reference voltages are provided, one close to the system logic high voltage and a second close to the system logic low voltage.

The pin clamp circuit according to the invention actively senses the pin voltage and enhances this voltage so as to cause a voltage-to-current converter to transmit an increased amount of current, relative to prior art passive pin clamp circuits, to the pin for a given amount of pin voltage undershoot or overshoot. As a result, the pin voltage is clamped more effectively than has been the case with prior art passive clamps. Additionally, the pin clamp circuit according to the invention allows physically small clamp circuits that are effective even for relatively high levels of noise in the input.

The input clamp circuit according to the invention may be used generally with integrated circuit devices, but it is particularly useful in applications where bipolar or Schottky devices are not available or might create adverse effects.

BRIEF DESCRIPTION OF THE DRAWINGS

FIG. 4 is a block diagram of a pin clamp according to an embodiment of the invention.

FIG. 5A is a schematic diagram of a reference voltage generator according to one embodiment of the invention for use in the pin clamp of FIG. 4.

FIG. 5B is a schematic diagram of a reference voltage generator according to another embodiment of the invention for use in the pin clamp of FIG. 4.

FIG. 5C is a schematic diagram of a reference voltage generator according to another embodiment of the invention for use in the pin clamp of FIG. 4.

FIG. 5D is a schematic diagram of a reference voltage generator according to another embodiment of the invention for use in the pin clamp of FIG. 4.

FIG. 6A is a schematic diagram of a differential amplifier according to one embodiment of the invention for use in the pin clamp of FIG. 4.

FIG. 6B is a schematic diagram of a differential amplifier according to another embodiment of the invention for use in the pin clamp of FIG. 4.

FIG. 7A is a schematic diagram of a voltage-to-current converter according to one embodiment of the invention for use in the pin clamp of FIG. 4.

FIG. 7B is a schematic diagram of a voltage-to-current converter according to another embodiment of the invention for use in the pin clamp of FIG. 4.

DETAILED DESCRIPTION OF THE PREFERRED EMBODIMENT

Figure 1:
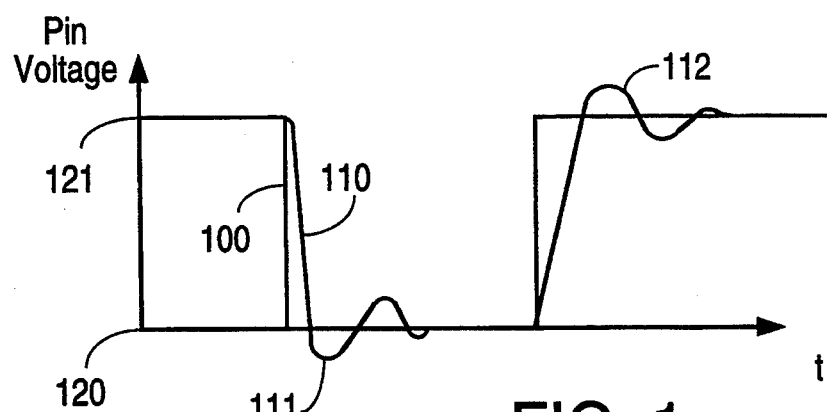
FIG. 1 is a graph of ideal and actual integrated circuit pin voltages as a function of time as the pin voltage switches between a system logic high voltage and a system logic low voltage.
Figure 2A:
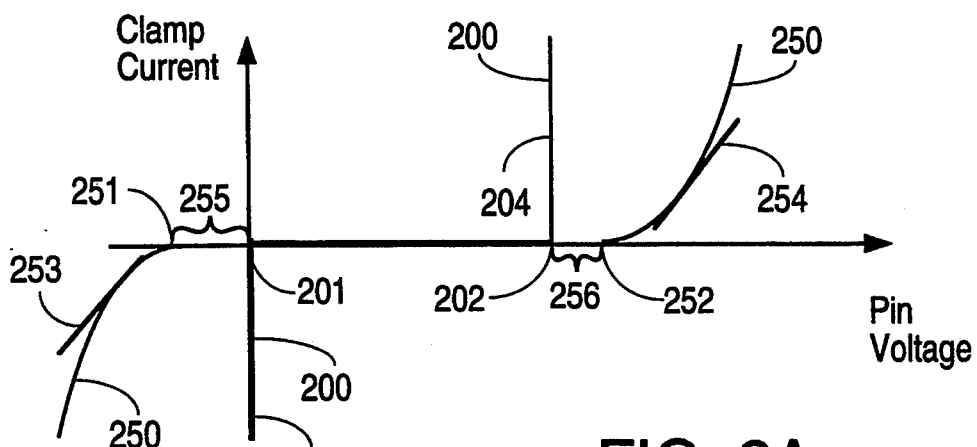
FIG. 2A is a graph of clamp current versus pin voltage for an ideal and an actual pin clamp circuit.
Figure 2B:
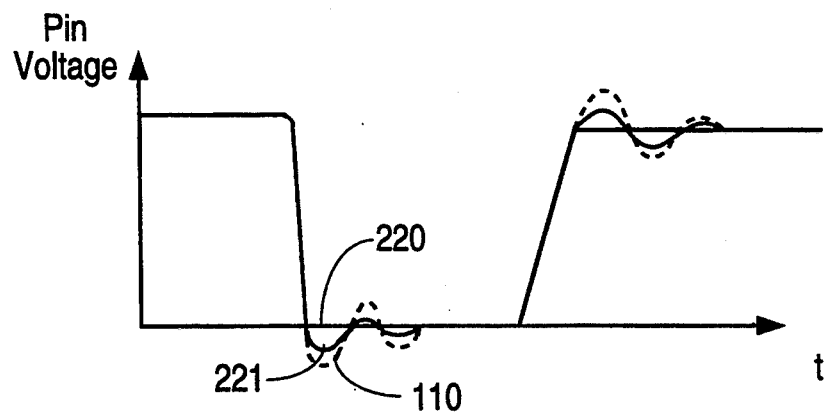
FIG. 2B is a graph of actual integrated circuit pin voltage as a function of time as the pin voltage switches between a system logic high voltage and a system logic low voltage for an ideal pin clamp circuit, an actual pin clamp circuit and an unclamped signal.
Figure 3A:
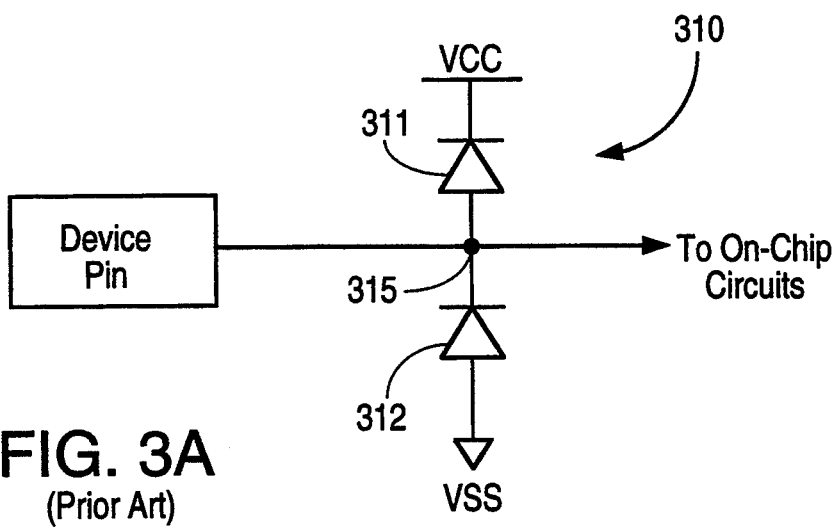
FIG. 3A is a schematic diagram of a prior art pin clamp circuit utilizing PN diodes.
Figure 3B:
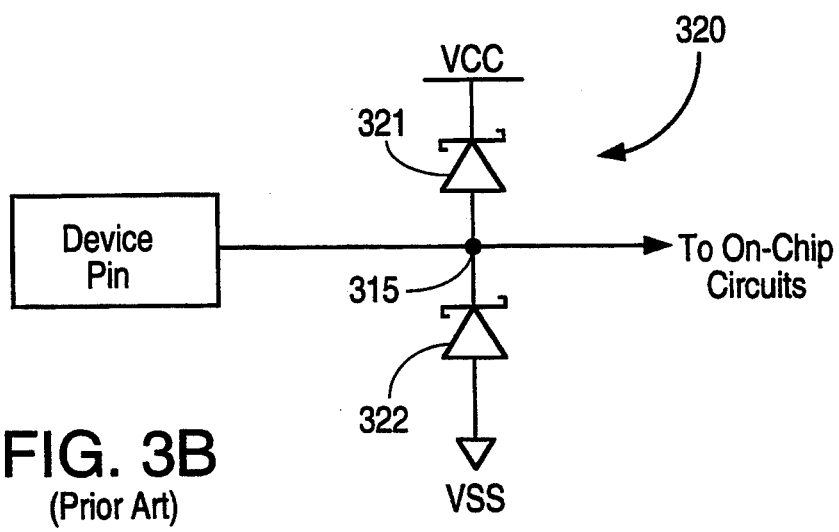
FIG. 3B is a schematic diagram of a prior art pin clamp circuit utilizing Schottky diodes.
Figure 3C:
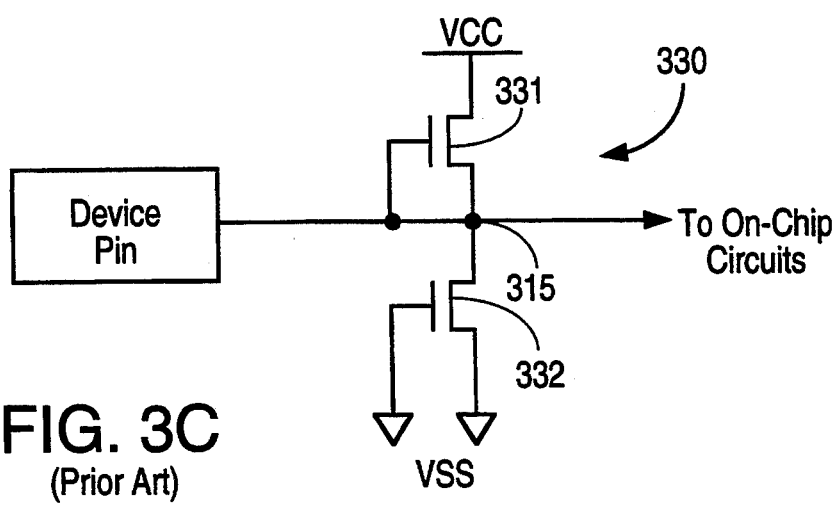
FIG. 3C is a schematic diagram of a prior art pin clamp circuit utilizing grounded gate enhancement-mode N-channel MOS transistors.

FIG. 4 is a block diagram of a pin clamp circuit 400 according to an embodiment of the invention. The clamp circuit 400 clamps device pin voltage in only a single direction (i.e., either undershoot or overshoot). Frequently, in practice, one of either the voltage overshoot or undershoot is a much greater problem than the other. Thus, typically, only one of either the overshoot or undershoot requires a pin clamp. Typically, in current digital systems, undershoot is more of a problem than overshoot. Therefore, embodiments of the device pin clamp according to the invention will be described in which only pin undershoot is clamped.

Additionally, in the description of embodiments of the invention, it will be assumed that the system supply voltage is a single-ended positive 5 volt supply as is typical in most digital logic systems. However, it is to be understood that the invention is applicable to integrated circuits having system supply voltages other than positive 5 volts.

Referring to FIG. 4, a voltage at node 405 is input to the pin clamp circuit 400 from the device pin 401. The voltage at node 405 is input to a minus input of a differential amplifier 411. The plus input of the differential amplifier 411 is a reference voltage at node 406 that is supplied by reference voltage generator 410. The voltages at nodes 405 and 406 are compared by the differential amplifier 411. The differential amplifier 411 amplifies the difference between the voltages at nodes 405 and 406 and outputs a voltage at node 407. The voltage at node 407 controls a voltage-to-current converter 412. The voltage-to-current converter 412 supplies clamp current 420 to node 405.

It should be noted that only one reference voltage generator 410 is required per integrated circuit chip, since the reference voltage at node 406 may easily be routed to all device pins. Thus, a single reference voltage generator 410 may serve more than one pin clamp circuit 400. However, each pin clamp circuit 400 requires a separate differential amplifier 411 and a separate voltage-to-current converter 412.

The value chosen for the reference voltage at node 406 determines the turn-on voltage of the clamp circuit 400 (i.e., the device pin voltage at node 405 that causes the voltage-to-current converter 412 to begin sourcing clamp current 420 to node 405). For device pin voltages at node 405 that are greater than or equal to the reference voltage at node 406, the differential amplifier 411 provides a zero voltage at node 407, thus causing the voltage-to-current converter 412 to provide no clamp current 420 to node 405. For device pin voltages at node 405 that are less than the reference voltage at node 406, the differential amplifier 411 provides an amplified voltage at node 407 that causes the voltage-to-current converter 412 to source clamp current 420 to node 405. The amplified voltage $V_{407}$ at node 407 is a function of the difference between the input voltages $V_{405}$ and $V_{406}$ at nodes 405 and 406, respectively, to the differential amplifier 411:

$$V_{407} = f_A(V_{406} - V_{405}) \tag{3}$$

The voltage-to-current converter 412 provides clamping current 420 in response to the difference between the voltage at node 405 and the voltage at node 407. When the voltage at node 405 is greater than or equal to the voltage at node 407, no clamping current 420 is supplied to node 405. When the voltage at node 405 is less than the voltage at node 407, clamping current 420 is supplied to node 405 as a function of the magnitude of the difference between the voltages at nodes 405 and 407:

$$I_{420} = f_B(V_{407} - V_{405}) \tag{4}$$

In order to facilitate explanation of the invention, two simplifying assumptions are made. First, the differential amplifier 411 is assumed to have linear gain so that the voltage at node 407 is given by the equation:

$$V_{407} = f_A(V_{406} - V_{405}) = K*(V_{406} - V_{405}) \tag{5}$$

where K represents the voltage gain of the differential amplifier 411 in units of volts/volt. Second, the voltage-to-current converter 412 is assumed to exhibit quadratic voltage-to-current conversion so that the clamp current 420 is a function of the square of the difference between the voltages at nodes 405 and 407:

$$I_{420} = f_B([V_{407} - V_{405}]^2) \tag{6}$$

These two assumptions are reasonable because, in practice, they are reasonably easy to approximate in digital MOS technologies and, in the preferred embodiment of the invention, both differential amplifier 411 and voltage-to-current converter 412 comprise MOS transistors. It is to be understood that electronic components having other more complex characteristics are likewise within the ambit of the invention, and the simplifying assumptions made above are made solely to facilitate understanding of the invention.

Assuming that the voltage-to-current converter 412 comprises a MOS transistor operating in the saturated region with the voltage at node 407 applied to the transistor gate, the transistor drain connected to system supply voltage $V_{CC}$ and the transistor source connected to node 405, and that $V_{GS}$ is greater than $V_{TN}$ (i.e., the transistor is turned on), the clamp current 420 is given by the equation:

$$I_{420} = f_B([V_{407} - V_{405}]^2) = \frac{\beta}{2} * [(V_{407} - V_{405}) - V_{TN}]^2 \tag{7}$$

where $\beta$ and $V_{TN}$ represent the same quantities as described above with respect to equation (1), and the quantity $V_{407} - V_{405}$ parallels the quantity $V_{GS}$ of equation (1). Combining equations (5) and (7), the clamp current 420 may be expressed by the equation:

$$I_{420} = \frac{\beta}{2} * \{(K * V_{406}) - [(K + 1) * V_{405}] - V_{TN}\}^2 \tag{8}$$

Assuming that K (i.e., the gain of the differential amplifier 411) is much larger than 1, equation (8) becomes:

$$I_{420} = \frac{\beta}{2} * \{(K * (V_{406} - V_{405})] - V_{TN}\}^2 \quad (9)$$

Equation (9) is of the same form as equation (1) describing the operation of grounded-gate transistor clamp circuit 330. Note that the quantity $V_{405} - V_{405}$ is roughly equivalent to $V_{GS}$ for the grounded gate transistor clamp circuit 330. It may be seen that, in the clamp circuit 400 according to the invention, this quantity is multiplied by the differential amplifier voltage gain K; thus, the clamp circuit 400 according to the invention will source a greater amount of clamp current 420 for a given amount of voltage undershoot.

Two exemplary undershoot scenarios illustrate the superior clamping ability of the clamp circuit 400 according to the invention. These scenarios are tabulated in Table I. In both scenarios, the voltage gain K of the differential amplifier 411 is assumed to be 5. In the first scenario, $V_{TN}=0.6$ volts, $V_{406}=0$ volts (a necessary condition for the grounded gate transistor clamp circuit 330 and a plausible, though not necessary, condition for the clamp circuit 400 according to the invention), and $V_{405}=-0.2$ volts (i.e., a small amount of device pin voltage undershoot). In the second scenario, $V_{TN}=0.6$ volts, $V_{406}=0$ volts, and $V_{405}=-1.0$ volts (i.e., a moderate amount of device pin voltage undershoot).

TABLE I

| Scenario | Clamp Circuit 330 | | Clamp Circuit 400 | |
|---|---|---|---|---|
|  | $V_{GS}-V_{TN}$ (volts) | $I_{CLAMP}$ (mA) | $K(V_{406}-V_{405})-V_{TN}$ (volts) | $I_{CLAMP}$ (mA) |
| 1<br>$V_{405}=-0.2$ volts | −0.4 | 0 (OFF) | 0.4 | .08β |
| 2<br>$V_{405}=-1.0$ volts | 0.4 | .08β | 4.4 | 9.68β |

As can be seen in Table I, the clamp circuit 400 according to the invention both turns on sooner than the prior art grounded gate transistor clamp circuit 330, and turns on "harder" as device pin voltage undershoot increases. For a device pin voltage undershoot of 0.2 volts (scenario 1) the clamp circuit 330 has not turned on, while the clamp circuit 400 has already begun sourcing clamp current 420 to node 405. When the device pin voltage undershoot reaches 1.0 volts (scenario 2), the clamp circuit 400 sources 121 times as much clamp current 420 as the clamp circuit 330. Thus, the clamp circuit 400 according to the invention dramatically increases clamping capacity as compared to the prior art clamp circuit 330.

Voltage Reference Generator

FIGS. 5A–5D show several embodiments of a reference voltage generator that could be used as the reference voltage generator 410 in the clamp circuit 400 of FIG. 4. The objective of the reference voltage generator 410 is to provide a relatively constant reference voltage at node 406 to the differential amplifier 411 for comparison to the device pin voltage at node 405. The reference voltage generator 510a of FIG. 5A comprises a depletion-mode N-channel transistor 501 connected in series with enhancement-mode N-channel transistor 502. The transistor 501 provides a small bias current to transistor 502. Transistor 502 is "diode-connected" (gate shorted to drain) such that the reference voltage at node 406 is approximately equal to the turn-on voltage of the transistor 502. Illustratively, this voltage is approximately 0.6 volts. The reference voltage 406 provided by the reference voltage generator 510a exhibits a small dependence on system supply voltage $V_{CC}$ and on temperature, on the order of +/−30 millivolts over the operating range of $V_{CC}$ and temperature. This tolerance is considered negligible for most applications. Other circuits offering greater precision can be implemented at the cost of additional components and/or power consumption.

Alternatively, the reference voltage at node 406 can be supplied directly by either of the device power supplies (i.e., $V_{CC}$ or $V_{SS}$) as illustrated in FIGS. 5B and 5C.

The reference voltage at node 406 could also be provided by the reference voltage generator 510d shown in FIG. 5D. The reference voltage generator 510d is a resistive voltage divider circuit comprising resistors 515 and 516, having resistances $R_{515}$ and $R_{516}$ respectively, such that the reference voltage at node 406 is given by the equation:

$$V_{406} = \frac{R_{516}}{R_{515} + R_{516}} * R_{CC} \quad (10)$$

The reference voltage generator 510d has a stronger dependence on system supply voltage $V_{CC}$ than the reference voltage generator 510a, but the reference voltage generator 510d may be desirable for certain applications.

Differential Amplifier

FIGS. 6A and 6B show alternative embodiments 611a and 611b, respectively, of the differential amplifier 411 according to the invention. The objective of each of the differential amplifiers 611a and 611b is to amplify the voltage difference between the device pin voltage at node 405 and the reference voltage at node 406. Typically, the gain of the differential amplifier 411 according to the invention is a linear gain. However, it is to be understood that other gain characteristics in which the gain is greater than 1 are within the ambit of the invention; it is not the particular gain characteristic that is crucial to the invention, but rather the existence of greater than unity gain. Additionally, it is desirable that the differential amplifier 411 according to the invention comprise a small number of devices (and thus occupy a small die area) and consume no DC power during "normal" operation (i.e., transistor 602a or 602b is off).

In FIG. 6A, the differential amplifier 611a comprises a depletion-mode N-channel transistor 601a connected in series with an enhancement-mode N-channel transistor 602a, and an inverter 603. In FIG. 6B, the differential amplifier 611b comprises a P-channel transistor 601b connected in series with an enhancement-mode N-channel transistor 602b, and an inverter 603.

Figure 6C:
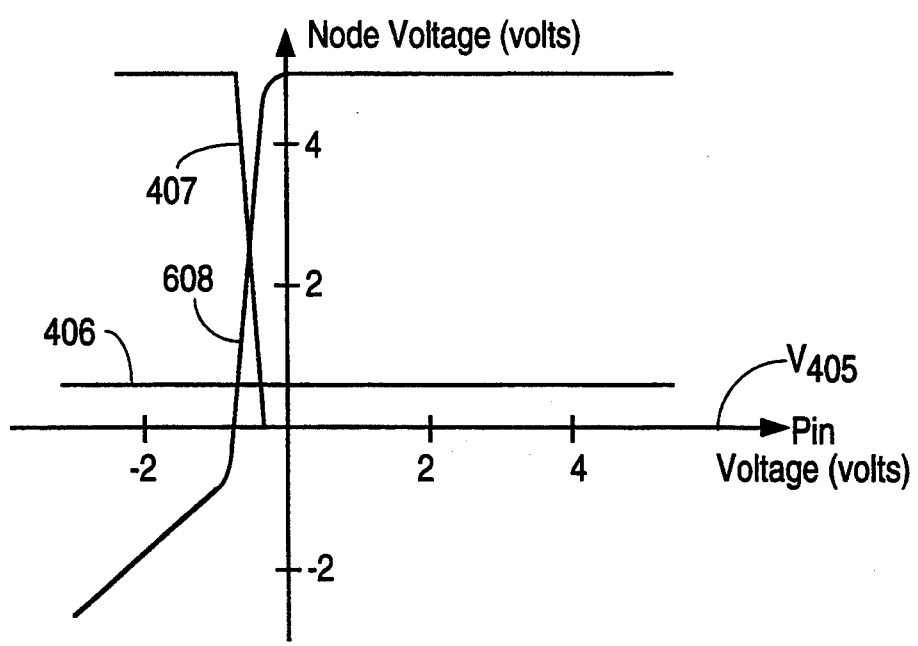
FIG. 6C is a graph of the voltages at various nodes of the differential amplifier of either FIG. 6A or 6B versus pin voltage.

FIG. 6C shows the transition of voltages at various nodes of either differential amplifier 611a or 611b as a function of the voltage at node 405 for a given value of $V_{406}$ (e.g., 0.6 volts). For both the differential amplifiers 611a and 611b, when used as differential amplifier 411 of FIG. 4, the voltage at node 406 is the plus input terminal and the voltage at node 405 is the minus input terminal of differential amplifier 411. In each of the differential amplifiers 611a and 611b, the enhancement-mode N-channel transistor 602a or 602b, respectively, will turn on when the voltage at node 405 falls below the reference voltage at node 406 by a threshold amount $V_{TN}$. When the voltage at node 405 falls sufficiently below the reference voltage at node 406 (i.e., approximately 1 volt), the enhancement-mode N-channel transistor 602a or 602b is turned on sufficiently to cause the voltage at node 608 to become approximately equal to the voltage at node 405. The voltage at node 608 is input to the inverting amplifier 603. When the voltage at node 608 becomes sufficiently low (i.e., approximately 1 volt below $V_{CC}$), the output voltage of the inverting amplifier (and, thus, the differential amplifier 611a or 611b) at node 407 becomes high (i.e., equal to $V_{CC}$). The high voltage at node 407 is input to the voltage-to-current converter 412, causing the voltage-to-current converter 412 to source clamp current 420 to node 405.

While the voltage at node 405 remains sufficiently high (i.e., less than $V_{TN}$ below the reference voltage at node 406), the enhancement-mode N-channel transistor 602a or 602b is off and the voltage at node 608 is equal to the system supply voltage $V_{CC}$. This high voltage at node 608 makes the output of the inverting amplifier at node 407 low, thus keeping the voltage-to-current converter 412 turned off so that no clamp current 420 is sourced to node 405.

The following characteristics of the differential amplifier 611a or 611b according to the invention should be noted from FIG. 6C. First, the clamp 400 turn-on voltage is approximately equal to $V_{406} - V_{TN}$ where $V_{TN}$ is the turn-on voltage of the enhancement-mode N-channel transistor 602a or 602b. By appropriately varying the relative sizes of either the transistors, e.g., transistors 601a, 601b of the differential amplifier, e.g., differential amplifier 611a, or the reference voltage 406, the clamp 400 turn-on voltage may be varied. Second, while the clamp 400 is turned off, the voltage at node 608 is equal to $V_{CC}$. While the clamp 400 is sufficiently turned on, the voltage at node 608 tracks the voltage at node 405. Third, while the clamp 400 is turned off, the voltage at node 407 is equal to $V_{SS}$. While the clamp 400 is sufficiently turned on, the voltage at node 407 is equal to $V_{CC}$.

Voltage to Current Conversion

FIGS. 7A and 7B show alternative embodiments 712a and 712b, respectively, of the voltage-to-current converter 412 according to the invention. In each of the embodiments 712a and 712b, the voltage-to-current converter 412 comprises a single enhancement-mode N-channel MOS transistor 701. In each of the embodiments 712a and 712b, the voltage at node 407 is applied to the gate of the transistor 701. The source of the transistor 701 is connected to node 405. In the voltage-to-current converter 712a, the drain of the transistor 701 is connected to the system supply voltage $V_{CC}$. In the voltage-to-current converter 712b, the drain of the transistor 701 is connected to the system ground voltage $V_{SS}$.

In the voltage-to-current converter 712a, since the transistor 701 drain is connected to system supply voltage $V_{CC}$, the transistor 701 will operate in the saturated region such that the clamp current 420 is given by the equation:

$$I_{420} = \frac{\beta}{2} * [(V_{407} - V_{405}) - V_{TN}]^2 \quad (11)$$

where $\beta$, $V_{TN}$ and $V_{407} - V_{405}$ represent the same quantities as described above with respect to equations (1) and (7).

In the voltage-to-current converter 712b (the preferred embodiment of the voltage-to-current converter 412), since the drain of transistor 701 is connected to system ground voltage $V_{SS}$, the transistor 701 operates in the linear region such that the clamp current 420 can be shown to be given by the equation:

$$I_{420} = \beta * V_{405} * \left( \frac{V_{405}}{2} + V_{TN} - V_{407} \right) \quad (12)$$

where $V_{TN}$ and $\beta$ represent the quantities discussed above.

For representative values $V_{405} = 1$ volt, $V_{TN} = 0.6$ volts, and $V_{407} = 5$ volts, Table II shows the amount of clamp current 420 sourced by the voltage-to-current converters 712a and 712b, and the grounded-gate transistor 332 of prior art clamp circuit 330.

TABLE II

| | Clamp Current (mA) | |
|---|---|---|
| Grounded-gate transistor 332 | Voltage-to-current converter 712a | Voltage-to-current converter 712b |
| .08$\beta$ | 14.58$\beta$ | 4.9$\beta$ |

As can be seen, either of the voltage-to-current converters 712a or 712b according to the invention source vastly more clamp current 420 than the grounded-gate transistor 332 of the prior art clamp circuit 330. Further, the voltage-to-current converter 712b has the additional desirable characteristic that the pin voltage at node 405 can not be pulled back above the system logic low voltage by the clamp circuit 400.

One Embodiment of the Invention

Figure 8:
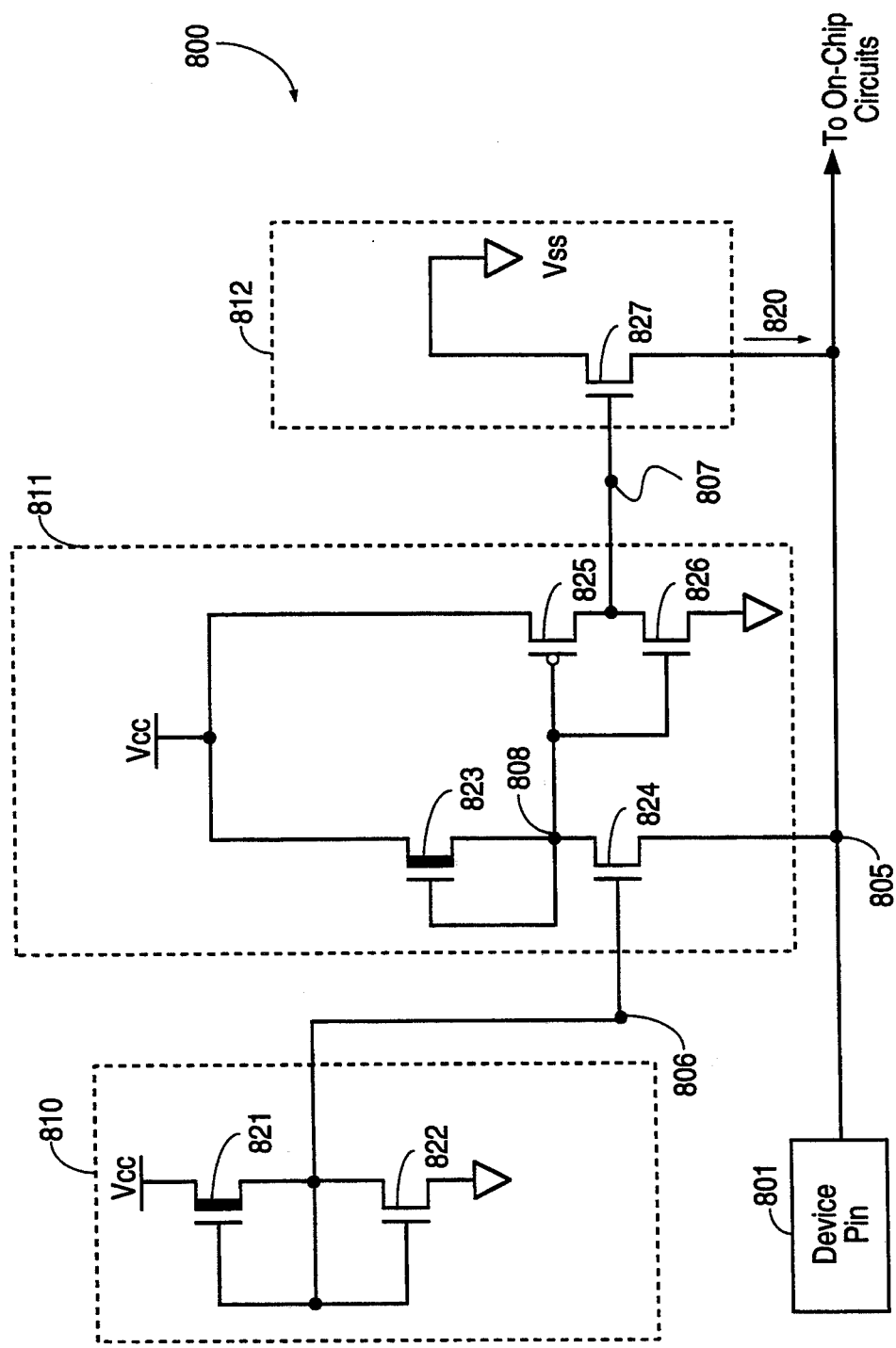
FIG. 8 is a schematic diagram of a pin clamp circuit according to one embodiment of the invention.

FIG. 8 is a schematic diagram of a clamp circuit 800 which is a particular embodiment of the clamp circuit 400 according to the invention. The clamp circuit 800 is configured to clamp device pin voltage undershoot. As previously noted, it is to be understood that an analogous clamp circuit could be provided with the clamp circuit 800, alone or in tandem, to clamp voltage overshoot.

The reference voltage generator 810 is comprised of an N-channel depletion-mode transistor 821 and an N-channel enhancement-mode transistor 822 connected in series between the system supply voltage $V_{CC}$ and the system ground voltage $V_{SS}$. The reference voltage at node 806 supplied by the reference voltage generator 810 is input as the plus input terminal to the differential amplifier 811 at the gate of transistor 824. The voltage at node 805 is input as the minus input terminal of the differential amplifier 811 at the source of the transistor 824.

The differential amplifier 811 is comprised of transistors 823, 824, 825 and 826. The differential amplifier 811 operates as described above with respect to the differential amplifier 611a of FIG. 6A. The differential amplifier 811 compares the voltages at nodes 806 and 805 and, when the voltage at node 805 is sufficiently less (approximately 1 volt) than the reference voltage at node 806, outputs a voltage at node 807 that is a function of the magnitude of the difference between the voltages at nodes 805 and 806.

The voltage at node 807 is an input signal to the voltage-to-current converter 812 which, in this embodiment of the invention, comprises an N-channel transistor 827. The voltage at node 807 controls the clamp current 820 supplied to the node 805 so as to prevent the voltage at node 805 from falling below the system logic low voltage.

The width and length (in micrometers) of the transistors in FIG. 8 are set forth below in Table III.

TABLE III

| Transistor No. | Width:Length |
|---|---|
| 821 | 10:3 |
| 822 | 400:1 |
| 823 | 12.5:4.5 |
| 824 | 60:2 |
| 825 | 55:1 |
| 826 | 10:1 |
| 827 | 150:1.5 |

Quantitative Results

Figure 9:
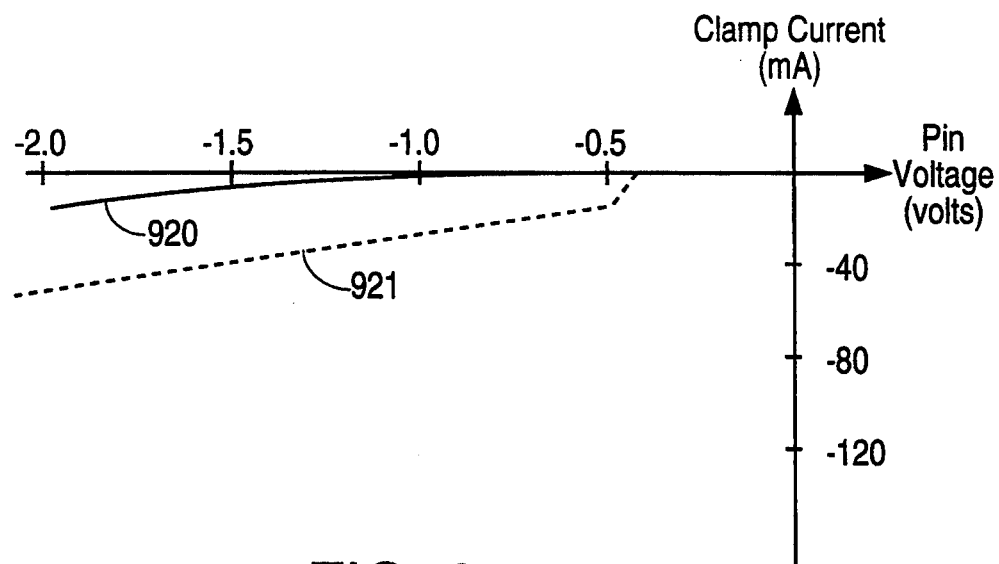
FIG. 9 is a graph of clamp current versus pin voltage for both a prior art pin clamp and a pin clamp according to the invention during the clamping of pin voltage undershoot illustrated in FIG. 11A.

FIG. 9 shows a comparison between the DC clamp current versus pin voltage characteristics of a prior art clamp circuit (the grounded-gate transistor clamp circuit 330) and the clamp circuit 800 according to the invention. The internal voltage characteristics of the clamp circuit 800 are shown in FIG. 6C and were previously discussed. The clamp circuit versus pin voltage characteristic of the prior art clamp circuit 330 is shown by the line 920 and the clamp current versus pin voltage characteristic of the clamp circuit 800 is shown by the dashed line 921. It can be seen that the clamp circuit 800 turns on sooner than the clamp circuit 330 and, for a given amount of voltage undershoot (i.e., negative pin voltage), the clamp circuit 800 sources more clamp current than the prior art clamp circuit 330. Thus, the clamp circuit 800 according to the invention does a better job of clamping pin voltage than the prior art clamp circuit 330. It should be noted that, for the results shown in FIG. 9, the transistor 827 in the clamp circuit 800 is the same size (150:1.5) as the transistor 332 in the clamp circuit 330.

Figure 10:
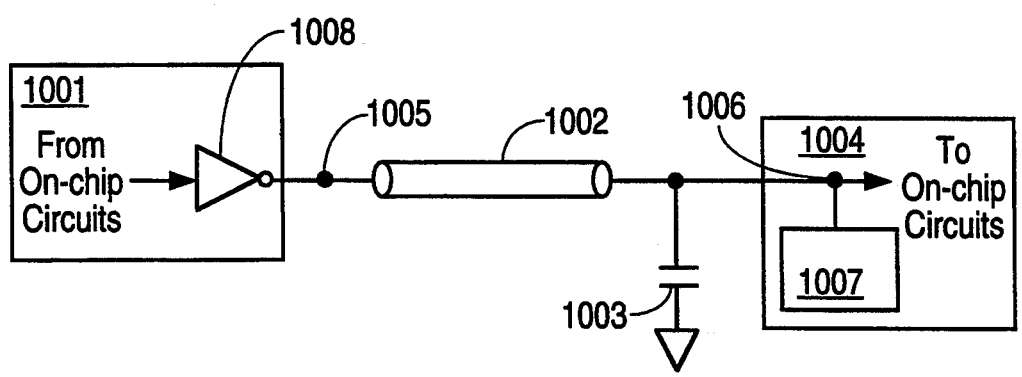
FIG. 10 is a schematic diagram of a typical signal path between two integrated circuits.

In addition to the DC voltage characteristic, an important characteristic of any clamp circuit is its ability to dynamically modify its impedance characteristic in order to limit incoming transient overshoot and undershoot voltages. FIG. 10 illustrates a typical circuit configuration that is representative of a single digital signal path found in many current digital systems. An integrated circuit 1001 is connected to a second integrated circuit 1004 by a transmission line 1002. Transmission line 1002 represents a printed circuit board trace of approximately 10 to 15 inches in length having an impedance of approximately 50 to 75 ohms. A capacitive load 1003 is also associated with the printed circuit board trace and other components (not shown) connected to the transmission line 1002 and is typically approximately 30 pF. The output driver 1008 of integrated circuit 1001 transmits output voltage signals at node 1005 having rising/falling edge rates of 1 to 2 volts per nanosecond. A pin clamp circuit 1007 is formed on integrated circuit 1004.

Figure 11A:
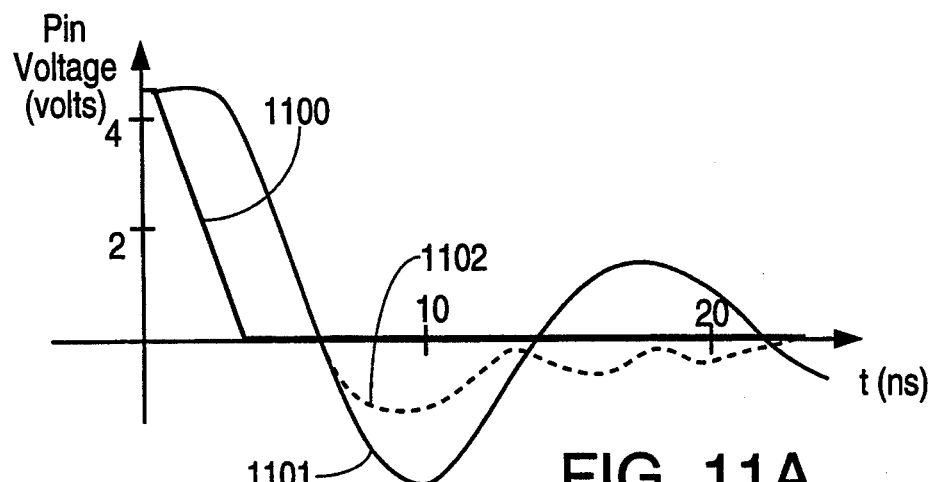
FIG. 11A is a graph of pin voltage versus time illustrating clamping of pin voltage undershoot by both a prior art pin clamp and a pin clamp according to the invention.
Figure 11B:
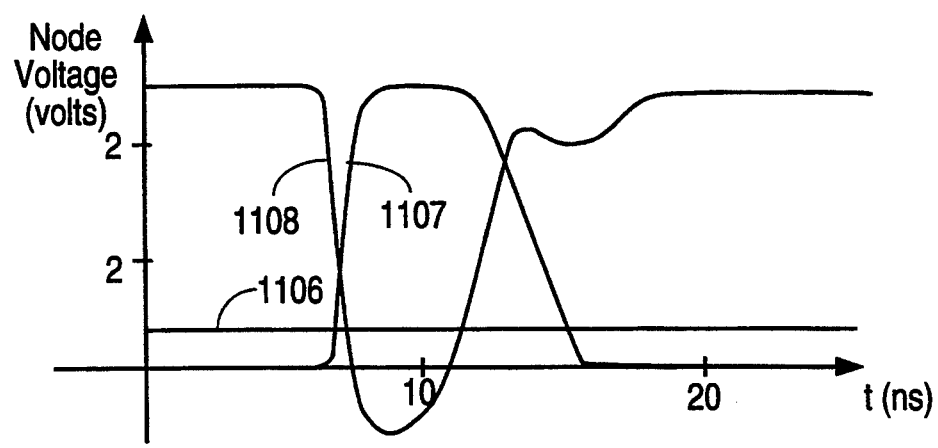
FIG. 11B is a graph of voltage versus time for various internal nodes of a pin clamp circuit according to the invention.
Figure 11C:
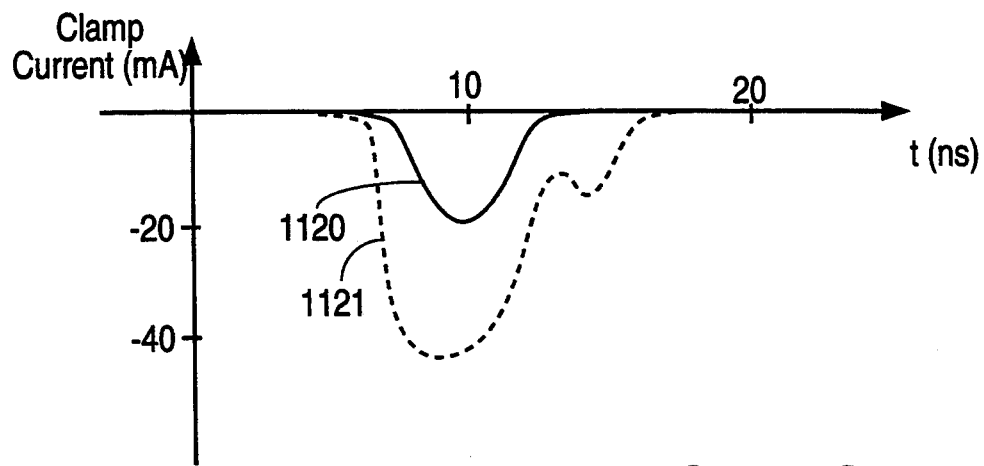
FIG. 11C is a graph of clamp current versus time for both a prior art pin clamp and a pin clamp according to the invention during the clamping of pin voltage undershoot illustrated in FIG. 11A.

FIGS. 11A-11C show a comparison between the AC voltage and clamp current characteristics of the prior art clamp circuit 330 and the clamp circuit 800 according to the invention. FIG. 11A shows a graph of pin voltage versus time. The voltage at node 1005 is shown by line 1100. The voltage at node 1006, when the prior art clamp circuit 330 is connected to node 1006, is shown by line 1101. The voltage at node 1006, when the clamp circuit 800 according to the invention is connected to node 1006, is shown by the dashed line 1102. As can be seen in FIG. 11A, the clamp circuit 800 according to the invention clamps pin voltage undershoot much better than the prior art clamp circuit 330. Additionally, the clamp circuit 800 according to the invention also helps minimize pin voltage overshoot that occurs with the prior art clamp circuit 330 after the pin voltage undershoot has been clamped.

FIGS. 11A and 11B show the AC characteristics of internal node voltages 805 (line 1102), 806 (line 1106), 807 (line 1107) and 808 (line 1108) of clamp circuit 800 according to the invention. As can be seen in FIGS. 11A and 11B, the clamp circuit 800 according to the invention sources clamp current 820 to node 805 for a period of approximately 8 nanoseconds (i.e., when $V_{807}$ is greater than $V_{805}$ by at least $V_{TN}$). As can be seen in FIG. 11C, the superior clamping of voltage undershoot by the clamp circuit 800 occurs because the clamp circuit 800 sources more clamp current 820, as shown by dashed line 1121, than the prior art clamp circuit 330, as shown by line 1120.

The clamp circuit 800 has a number of advantageous characteristics. First, while the voltage at node 805 remains within the normal operating region (i.e., in this embodiment of the invention, above the system logic low voltage), DC power is only required to supply the bias current consumed by the reference voltage generator 810. However, where the reference voltage at node 806 is supplied by direct connection to either the system supply voltage $V_{CC}$ or the system ground voltage $V_{SS}$, even this DC power is not required.

Second, the reference voltage at node 806 supplied by the reference voltage generator 810 may be adjusted to provide any desired clamp turn-on voltage. Thus, multiple reference voltage generators could be provided to allow different device pins to have different clamp turn-on voltages and, therefore, different clamping characteristics.

Third, low values of clamp resistance are provided while maintaining reasonable device sizes. As compared to prior art clamp circuits (e.g., grounded-gate transistor clamp circuit 330), the clamp circuit 800 allows clamp device size reductions on the order of 10 to 1 for a given level of clamp current 820 (i.e., clamping ability). This characteristic becomes increasingly important as the desired clamp current 820 values increase (e.g., to 80 mA or more).

Fourth, the clamp circuit 800 does not utilize any bipolar transistors or diodes (i.e., no minority carrier devices). Since only majority carrier MOS devices are used, the problems with latch-up encountered in prior art clamps are avoided.

Fifth, since the clamp circuit 800 comprises only MOS transistors, standard MOS processing steps may be used to form the clamp circuit 800, simplifying production.

Above, various embodiments of the invention have been described. The descriptions are intended to be illustrative, not limitative of the present invention. Thus, it will be apparent to one skilled in the art that certain modifications may be made to the invention as described without departing from the scope of the claims set out below.

I claim:

1. An integrated circuit, comprising:

a reference voltage generator which supplies a first reference voltage;

means for comparing the first reference voltage and a first voltage associated with a node to produce a second voltage; and means for comparing the first and second voltages to provide current to the node responsive to the difference between the first and second voltages.

2. An integrated circuit as in claim 1, further comprising a plurality of pins for inputting or outputting an electrical signal to or from the integrated circuit, wherein the node is one of the plurality of pins.

3. An integrated circuit as in claim 1, wherein the means for comparing the first reference voltage and the first voltage comprises:

a depletion-mode N-channel transistor;

an enhancement-mode N-channel transistor connected in series with the depletion-mode N-channel transistor; and an inverting amplifier.

4. An integrated circuit as in claim 1, wherein the means for comparing the first reference voltage and the first voltage comprises:

a P-channel transistor;

an enhancement-mode N-channel transistor connected in series with the P-channel transistor; and an inverting amplifier.

5. An integrated circuit as in claim 1, wherein the first reference voltage is equal to a supply voltage.

6. An integrated circuit as in claim 1, wherein the first reference voltage is equal to a ground voltage.

7. An integrated circuit as in claim 1, wherein the reference voltage generator comprises a resistive voltage divider circuit.

8. An integrated circuit as in claim 1, wherein the reference voltage generator comprises:

a depletion-mode N-channel transistor; and an enhancement-mode N-channel transistor connected in series with the depletion-mode N-channel transistor.

9. An integrated circuit as in claim 1, wherein the means for comparing the first and second voltages comprises an enhancement-mode MOS transistor with a source connected to the first voltage, a gate connected to the second voltage and a drain connected to a second reference voltage.

10. An integrated circuit as in claim 9, wherein the second reference voltage is substantially equal to a ground voltage.

11. An integrated circuit as in claim 9, wherein the second reference voltage is substantially equal to the first reference voltage.

12. An integrated circuit as in claim 9, wherein the second reference voltage is substantially equal to a supply voltage.

13. An integrated circuit as in claim 9, wherein:

the reference voltage generator further comprises:

a depletion-mode N-channel transistor; and an enhancement-mode N-channel transistor connected in series with the depletion-mode N-channel transistor; and the means for comparing the first reference voltage and the first voltage comprises:

a depletion-mode N-channel transistor;

an enhancement-mode N-channel transistor connected in series with the depletion-mode N-channel transistor; and an inverting amplifier.

14. A method for clamping the voltage at a node of an integrated circuit, the method comprising the steps of:

generating a first reference voltage;

comparing the first reference voltage and a first voltage associated with the node to produce a second voltage; and comparing the first and second voltages to provide current to the node responsive to the difference between the first and second voltages.

15. A method as in claim 14, wherein the node is a pin for inputting or outputting an electrical signal to or from the integrated circuit.

16. A method as in claim 14, wherein the first reference voltage is equal to a supply voltage.

17. A method as in claim 14, wherein the first reference voltage is equal to a ground voltage.

18. A method as in claim 14, wherein the step of generating a first reference voltage is done by a resistive voltage divider circuit.

19. A method as in claim 14, wherein the step of comparing the first reference voltage and the first voltage is done by a depletion-mode N-channel transistor, an enhancement-mode N-channel transistor connected in series with the depletion-mode N-channel transistor, and an inverting amplifier.

20. A method as in claim 14, wherein the step of comparing the first reference voltage and the first voltage is done by a P-channel transistor, an enhancement-mode N-channel transistor connected in series with the P-channel transistor, and an inverting amplifier.

21. A method as in claim 14, wherein the step of generating a first reference voltage is done by a depletion-mode N-channel transistor and an enhancement-mode N-channel transistor connected in series with the depletion-mode N-channel transistor.

22. A method as in claim 14, wherein the step of generating a first reference voltage is done by a P-channel transistor and an enhancement-mode N-channel transistor connected in series with the P-channel transistor.

23. A method as in claim 14, wherein the step of comparing the first and second voltages is done by an enhancement-mode MOS transistor with a source connected to the first voltage, a gate connected to the second voltage and a drain connected to a second reference voltage.

24. An integrated circuit as in claim 23, wherein the second reference voltage is substantially equal to a ground voltage.

25. An integrated circuit as in claim 23, wherein the second reference voltage is substantially equal to the first reference voltage.

26. An integrated circuit as in claim 23, wherein the second reference voltage is substantially equal to a supply voltage.

* * * * *